US012562732B2

(12) United States Patent
Takahashi et al.

(10) Patent No.: US 12,562,732 B2
(45) Date of Patent: Feb. 24, 2026

(54) SWITCHING DEVICE, ELECTRONIC DEVICE, AND VEHICLE

(71) Applicant: ROHM CO., LTD., Kyoto (JP)

(72) Inventors: Naoki Takahashi, Kyoto (JP);
Shuntaro Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 126 days.

(21) Appl. No.: 18/463,610

(22) Filed: Sep. 8, 2023

(65) Prior Publication Data

US 2024/0097677 A1 Mar. 21, 2024

(30) Foreign Application Priority Data

Sep. 16, 2022 (JP) ................................. 2022-147695

(51) Int. Cl.
*H03K 17/687* (2006.01)
*B60R 16/03* (2006.01)
(52) U.S. Cl.
CPC ........... *H03K 17/687* (2013.01); *B60R 16/03* (2013.01)
(58) Field of Classification Search
CPC .......................... H03K 17/687; H03K 17/0822
See application file for complete search history.

(56) References Cited

U.S. PATENT DOCUMENTS

| | | | | |
|---|---|---|---|---|
| 5,528,446 A | * | 6/1996 | Sankaran | H02M 1/32 |
| | | | | 361/25 |
| 6,392,463 B1 | * | 5/2002 | Kitagawa | H03K 17/08142 |
| | | | | 327/309 |
| 7,167,030 B2 | * | 1/2007 | Kitagawa | H03K 5/08 |
| | | | | 327/108 |
| 10,826,479 B2 | * | 11/2020 | Hu | H03K 17/063 |
| 2005/0168157 A1 | * | 8/2005 | Melis | H05B 41/2883 |
| | | | | 315/291 |
| 2018/0145676 A1 | * | 5/2018 | Tran | H03K 19/017509 |
| 2020/0395933 A1 | * | 12/2020 | Arisawa | H03K 17/08122 |
| 2022/0416783 A1 | * | 12/2022 | Hou | H03K 17/08104 |
| 2024/0364213 A1 | * | 10/2024 | Nosaka | H02M 7/537 |

FOREIGN PATENT DOCUMENTS

JP 2020-108142 7/2020

* cited by examiner

*Primary Examiner* — Sibin Chen
(74) *Attorney, Agent, or Firm* — Fish & Richardson P.C.

(57) ABSTRACT

A switching device, for example, includes a P-type semi-conductor substrate configured to be fed with a ground voltage, a switching element connected between an application terminal for a supply voltage and an application terminal for an output voltage, a driver configured to turn on and off the switching element, and an active clamp circuit configured to control the switching element so as to keep the output voltage at an off transition of the switching element equal to or higher than a lower limit voltage lower than the ground voltage by an active clamp voltage.

8 Claims, 9 Drawing Sheets

SWITCHING DEVICE, ELECTRONIC DEVICE, AND VEHICLE

CROSS-REFERENCE TO RELATED APPLICATIONS

This application is based on and claims the benefit of priority from Japanese Patent Application No. 2022-147695 filed on Sep. 16, 2022, the contents of which are hereby incorporated by reference.

BACKGROUND OF THE INVENTION

1. Technical Field

The present disclosure relates to a switching device, and to an electronic device and a vehicle using a switching device.

2. Description of Related Art

The present applicant has been proposing many new technologies regarding switching devices such as vehicle-onboard IPDs (intelligent power devices) (see, for example, Japanese Patent Application 2020-108142).

DETAILED DESCRIPTION

<Semiconductor Integrated Circuit Device (Basic Configuration)>

Figure 1:
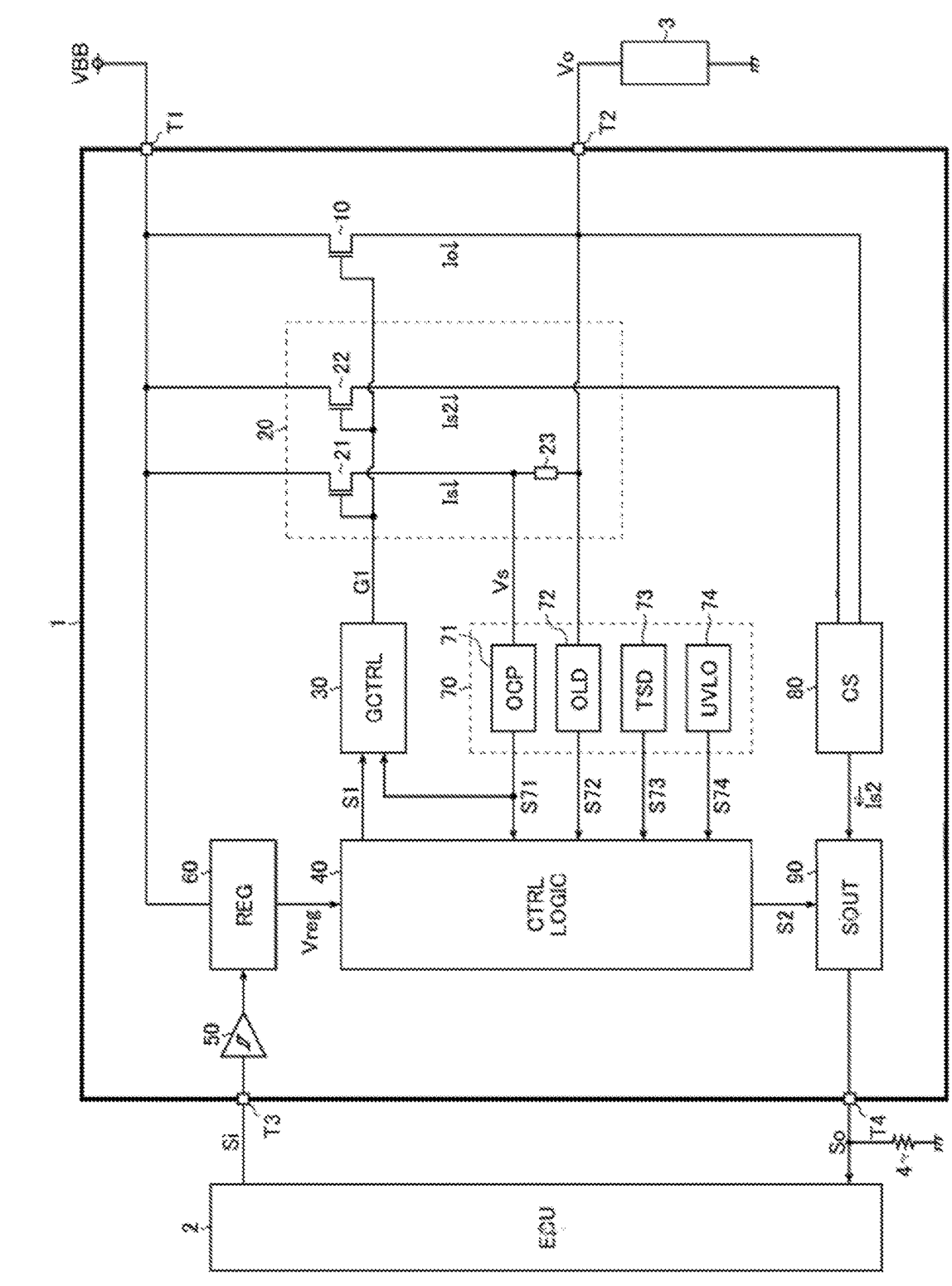
FIG. 1 is a diagram showing the basic configuration of a semiconductor integrated circuit device.

FIG. 1 is a diagram showing the basic configuration of a semiconductor integrated circuit device. The semiconductor integrated circuit device 1 of this configuration example is a vehicle-onboard high-side switch LS1 (a kind of vehicle-onboard IPD) that switches between a conducting state and a cut-off state the path between an application terminal for a supply voltage VBB and a load 3 according to instructions from an ECU (electronic control unit) 2.

The semiconductor integrated circuit device 1 includes external terminals T1 to T4 as means for establishing electrical connection with outside the device. The external terminal T1 is a supply terminal (VBB pin) for receiving the supply voltage VBB (for example, 12 V) fed from an unillustrated battery. The external terminal T2 is a load connection terminal or an output terminal (OUT pin) for externally connecting a load 3 (bulb lamp, relay coil, solenoid, light-emitting diode, motor, or the like). The external terminal T3 is a signal input terminal (IN pin) for receiving an external control signal Si from the ECU 2. The external terminal T4 is a signal output terminal (SENSE pin) for externally feeding a state indication signal So to the ECU 2. Between the output terminal T4 and a ground terminal, an external sense resistor 4 is externally connected.

The semiconductor integrated circuit device 1 has, as its components, the following integrated in it: an NMOSFET (N-channel metal-oxide-semiconductor field-effect transistor) 10, an output current monitoring circuit 20, a gate controller 30, a control logic circuit 40, a signal input circuit 50, an internal power source 60, a fault protector 70, an output current detector 80, and a signal output circuit 90.

The NMOSFET 10 is a high-withstand-voltage power transistor (with a withstand voltage of, for example, 42 V) having its drain connected to the external terminal T1 and its source connected to the external terminal T2. The NMOSFET 10 so connected operates as a switching element (high-side switch) for switching between a conducting state and a cut-off state the current path from the application terminal for the supply voltage VBB to the ground terminal via the load 3. The NMOSFET 10 is on when a gate driving signal G1 is at high level, and is off when the gate driving signal G1 is at low level.

The NMOSFET 10 can be designed to have an on resistance Ron of several tens of milliohms. However, the lower the on resistance Ron of the NMOSFET 10, the more likely an overcurrent flows when a ground short fault occurs at the external terminal T2 (that is, a fault of short-circuiting to the ground terminal or a comparable low-potential terminal), and the more likely overheating occurs. Thus, as the on resistance Ron of the NMOSFET 10 is reduced, the importance of an overcurrent protection circuit 71 and a temperature protection circuit 73, which will be described later, increases.

The output current monitoring circuit 20 includes NMOSFETs 21 and 22 and a sense resistor 23, and generates a sense voltage Vs (corresponding to a sense signal) according to an output current Io flowing through the NMOSFET 10.

The NMOSFETs 21 and 22 are both sense transistors that are driven synchronously with the NMOSFET 10, and generate sense currents Is and Is2 according to the output current Io. The size ratio between the NMOSFET 10 and the NMOSFETs 21 and 22 is m:1 (where m>1). Thus, the sense currents Is and Is2 have 1/m of the magnitude of the output current Io. The NMOSFETs 21 and 22, like the NMOSFET 10, are on when the gate driving signal G1 is at high level, and are off when the gate driving signal G1 is at low level.

The sense resistor 23 (with a resistance value Rs) is connected between the source of the NMOSFET 21 and the external terminal T2, and is a current-voltage conversion element that generates the sense voltage Vs ($=\text{Is}\times\text{Rs}+\text{Vo}$, where Vo is the output voltage appearing at the external terminal T2) according to the sense current Is.

The gate controller 30 generates the gate driving signal G1 by increasing the current capacity of a gate control signal S1 and feeds the result to the gate of the NMOSFET 10 (and the NMOSFETs 21 and 22), thereby to turn the NMOSFET 10 on and off. The gate controller 30 has a function to control the NMOSFET 10 so as to limit the output current Io according to an overcurrent protection signal S71.

The control logic circuit 40 is fed with an internal supply voltage Vreg and generates the gate control signal S1. For example, if the external control signal S1 is at high level (that is, the logic level to turn on the NMOSFET 10), the internal supply voltage Vreg is fed from the internal power source 60, so the control logic circuit 40 is enabled and the gate control signal S1 is at high level (=Vreg). By contrast, if the external control signal S1 is at low level (that is, the logic level to turn off the NMOSFET 10), the internal supply voltage Vreg is not fed from the internal power source 60, so the control logic circuit 40 is disabled and the gate control signal S1 is at low level (=GND). The control logic circuit 40 also monitors various fault protection signals (an overcurrent protection signal S71, an open protection signal S72, a temperature protection signal S73, and an undervoltage protection signal S74). The control logic circuit 40 also has a function of generating an output switching signal S2 according to the results of monitoring the overcurrent protection signal S71, the open protection signal S72, and the temperature signal S73 among the just-mentioned fault protection signals.

The signal input circuit 50 is a Schmitt trigger that receives from the external terminal T3 the external control signal Si and transmits it to the control logic circuit 40 and the internal power source 60. The external control signal Si is, for example, at high level when the NMOSFET 10 is on and at low level when the NMOSFET 10 is off.

The internal power source 60 generates from the supply voltage VBB a predetermined internal supply voltage Vreg and feeds it to different parts in the semiconductor integrated circuit device 1. Whether to enable or disable the internal power source 60 is controlled according to the external control signal Si. More specifically, the internal power source 60 is enabled when the external control signal Si is at high level and is disabled when the external control signal Si is at low level.

The fault protector 70 is a circuit block that detects various faults in the semiconductor integrated circuit device 1 and includes an overcurrent protection circuit 71, an open protection circuit 72, a temperature protection circuit 73, and an undervoltage protection circuit 74.

The overcurrent protection circuit 71 generates the overcurrent protection signal S71 according to the result of monitoring the sense voltage Vs (that is, whether an overcurrent fault is present in the output current 1o). The overcurrent protection signal S71 is, for example, at low level when no fault is being detected and at high level when a fault is being detected.

The open protection circuit 72 generates the open protection signal S72 according to the result of monitoring the output voltage Vo (that is, whether an open fault is present in the load 3). The open protection signal S72 is, for example, at low level when no fault is being detected and at high level when a fault is being detected.

The temperature protection circuit 73 includes a temperature sensing element (not illustrated) that detects abnormal heating in the semiconductor integrated circuit device 1 (particularly around the NMOSFET 10) and that generates the temperature protection signal S73 according to the result of the monitoring (that is, whether an overheating fault is present). The temperature protection signal S73 is, for example, at low level when no fault is being detected and at high level when a fault is being detected.

The undervoltage protection circuit 74 generates the undervoltage protection signal S74 according to the result of monitoring the supply voltage VBB or the internal supply voltage Vreg (that is, whether an undervoltage fault is present). The undervoltage protection signal S74 is, for example, at low level when no fault is being detected and at high level when a fault is being detected.

The output current detector 80 uses an unillustrated biasing means to make the source voltage of the NMOSFET 22 equal to the output voltage Vo; it thereby generates the sense current Is2 (Io/m) according to the output current Io and feeds the sense current Is2 to the signal output circuit 90.

The signal output circuit 90, based on the output switching signal S2, selectively outputs one of the sense current Is2 (corresponding to the result of monitoring the output current Io) and a fixed voltage V90 (corresponding to a fault flag, which is not specifically shown in FIG. 1) to the external terminal T4. If the sense current Is2 is selectively output, as the state indication signal So, an output detection voltage V80 (Is2×R4) obtained by subjecting the sense current Is2 to current-voltage conversion by the external sense resistor 4 (with a resistance value R4) is transmitted to the ECU 2. The output detection voltage V80 becomes higher as the output current Io increases, and becomes lower as the output current Io decreases. By contrast, if the fixed voltage V90 is selectively output, as the state indication signal So, the fixed voltage V90 is transmitted to the ECU 2. If the current value of the output current Io needs to be read from the state indication signal So, that can be done by subjecting the state indication signal So to A/D (analog-to-digital) conversion. By contrast, if the fault flag needs to be read from the state indication signal So, that can be done by determining the logic level of the state indication signal So using a threshold value slightly lower than the fixed voltage V90.

<Gate Controller (First Configuration Example)>

Figure 2:
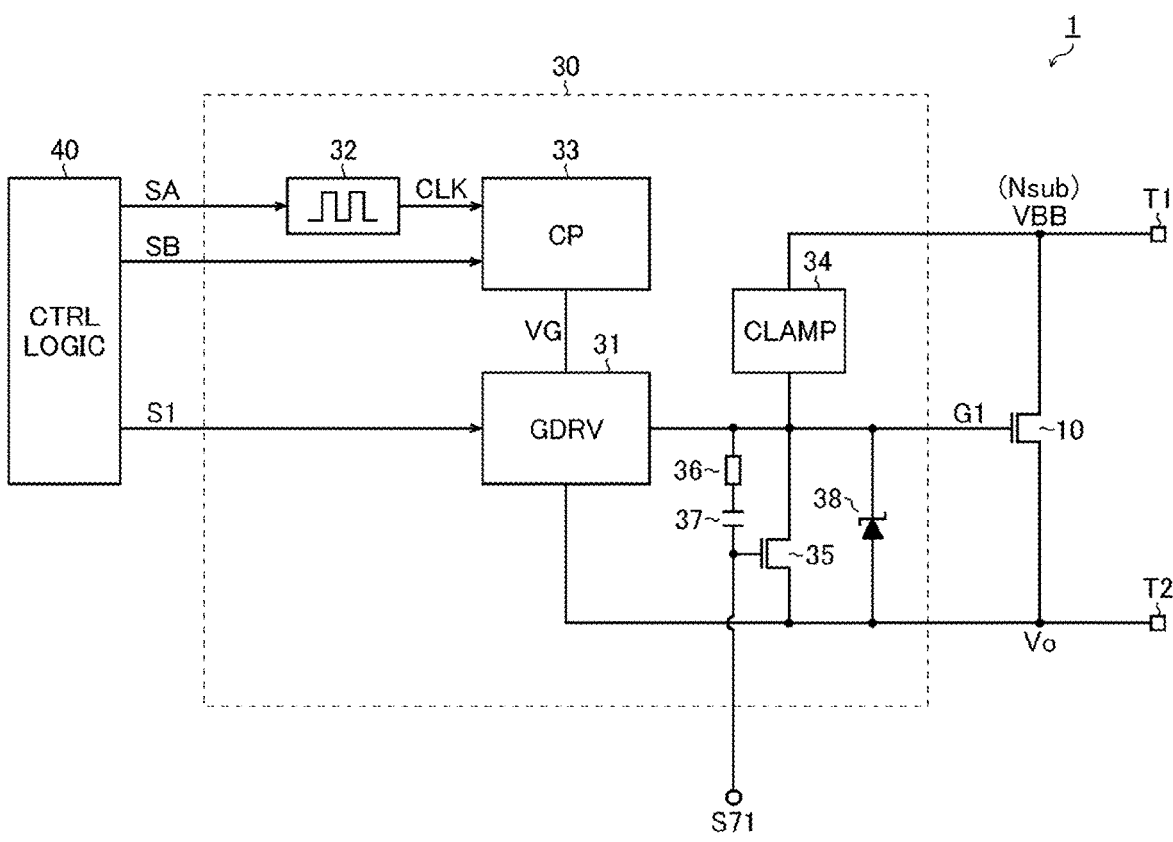
FIG. 2 is a diagram showing a first configuration example of a gate controller (an NSUB process).

FIG. 2 is a diagram showing a first configuration example of the gate controller 30 (in the case of an NSUB process using an N-type semiconductor substrate Nsub). The gate controller 30 in FIG. 2 includes a gate driver 31, an oscillator 32, a charge pump 33, an active clamp circuit 34, an NMOSFET 35, a resistor 36 (with a resistance value R36), a capacitor 37 (with a capacitance value C37), and a Zener diode 38.

Note that, in the semiconductor integrated circuit device 1 in the NSUB process, the supply voltage VBB is applied to the N-type semiconductor substrate Nsub.

The gate driver 31 is connected between the output terminal of the charge pump 33 (that is, an application terminal for a boost voltage VG) and the external terminal T2 (that is, an application terminal for the output voltage Vo), and generates the gate driving signal G1 by increasing the current capacity of the gate control signal S1. The gate driving signal G1 is at high level when the gate control signal S1 is at high level (VG) and at low level when the gate control signal S1 is at low level (Vo).

The oscillator 32 generates a clock signal CLK with a predetermined frequency and feeds it to the charge pump 33. Whether to enable or disable the oscillator 32 is controlled according to an enable signal SA from the control logic circuit 40.

The charge pump 33 is one example of a boost circuit that, using the clock signal CLK, drives a flying capacitor and thereby generates the boost voltage VG higher than the supply voltage VBB to feed the boost voltage VG to the gate driver 31. Whether to enable or disable the charge pump 33 is controlled according to an enable signal SB from the control logic circuit 40.

The active clamp circuit 34 is connected between the external terminal T1 (that is, the application terminal for the supply voltage VBB) and the gate of the NMOSFET 10. In an application in which an inductive load 3 is connected to the external terminal T2, when the NMOSFET 10 is switched from on to off, a counter-electromotive force in the load 3 causes the output voltage Vo to become a negative voltage (Vo<GND). To cope with that, the active clamp circuit 34 is provided for energy absorption.

The drain of the NMOSFET 35 is connected to the gate of the NMOSFET 10. The source of the NMOSFET 35 is connected to the external terminal T2. The gate of the NMOSFET 35 is connected to an application terminal for the overcurrent protection signal S71. Between the drain and the gate of the NMOSFET 35, the resistor 36 and the capacitor 37 are connected in series.

The cathode of the Zener diode 38 is connected to the gate of the NMOSFET 10. The anode of the Zener diode 38 is connected to the source of the NMOSFET 10. The Zener diode 38 so connected functions as a clamp element that limits the gate-source voltage of the NMOSFET 10 (G1-Vo) to a predetermined value or less.

In the gate controller 30 of this configuration example, if the overcurrent protection signal S71 rises to high level, the gate driving signal G1 is lowered from the steady-state high level (VG) with a predetermined time constant τ (R36×C37). Thus, the conductivity of the NMOSFET 10 gradually drops, so that the output current Io is limited. By contrast, if the overcurrent protection signal S71 falls to low level, the gate driving signal G1 is raised with the predetermined time constant τ. Thus, the conductivity of the NMOSFET 10 gradually rises, so that the output current Io is released from the limitation.

As described above, the gate controller 30 of this configuration example has the function of controlling the gate driving signal G1 to limit the output current Io according to the overcurrent protection signal S71.

Figure 3:
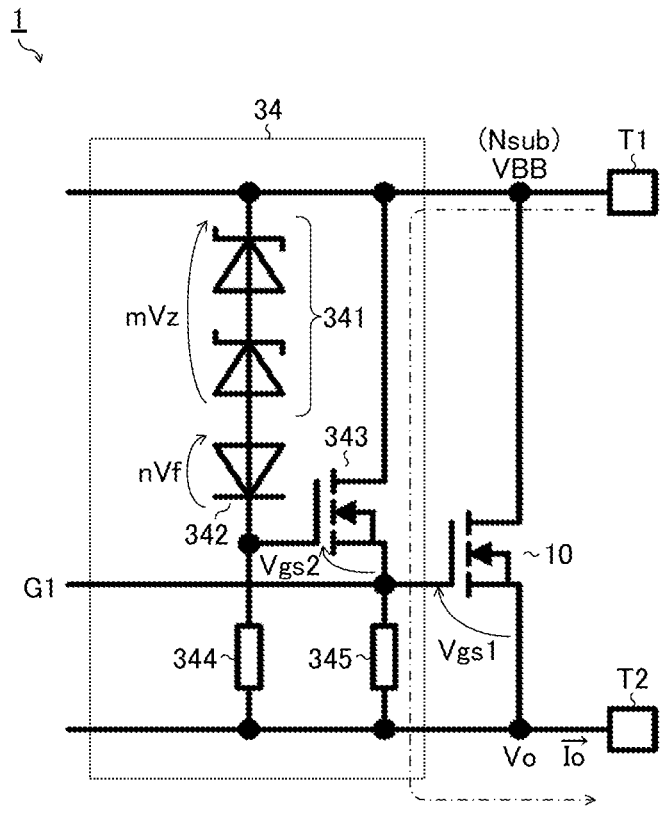
FIG. 3 is a diagram showing an active clamp circuit in the first configuration example.

FIG. 3 is a diagram showing one configuration example of the active clamp circuit 34 in the gate controller 30 of the first configuration example. The active clamp circuit 34 of this configuration example includes an m-stage Zener diode string 341 (m=2 in FIG. 3), an n-stage diode string 342 (n=1 in FIG. 3), an NMOSFET 343, and resistors 344 and 345.

The cathode of the Zener diode string 341 and the drain of the NMOSFET 343 are, together with the drain of the NMOSFET 10, connected to the external terminal T1 (corresponding to a first terminal connected to the application terminal for the supply voltage VBB). The anode of the Zener diode string 341 is connected to the anode of the diode string 342. The cathode of the diode string 342 and the first end of the resistor 344 are both connected to the gate of the NMOSFET 343. The source of the NMOSFET 343 and the first end of the resistor 345 are both connected to the gate of the NMOSFET 10 (that is, an application terminal for the gate driving signal G1). The source of the NMOSFET 10 and the second ends of the resistors 344 and 345 are all connected to the external terminal T2 (corresponding to a second terminal connected to the first end of the load 3). As the load 3, an inductive load such as coil or solenoid can be connected.

To follow is a description of the active clamp operation by the active clamp circuit 34, where the gate-source voltages of the NMOSFETs 10 and 343 are referred as Vgs 1 and Vgs 2 respectively, the breakdown voltage of the Zener diode string 341 is referred as mVz, and the forward drop voltage of the diode string 342 is referred as nVf.

Figure 4:
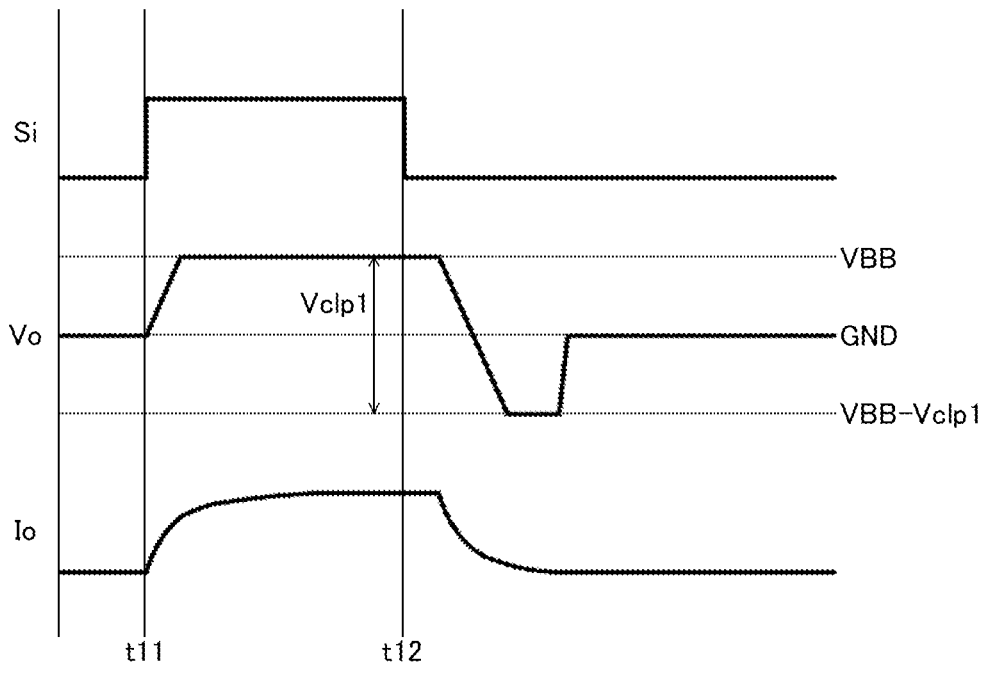
FIG. 4 is a diagram showing active clamp operation in the first configuration example.

FIG. 4 is a diagram showing the active clamp operation by the active clamp circuit 34. FIG. 4 depicts, from top down, the external control signal S1, the output voltage Vo, and the output current Io. It is assumed that, as the load 3, an inductive load is connected.

When, at time point t11, the external control signal S1 rises to high level (that is, the logic level to turn on the NMOSFET 10), the gate driving signal G1 rises to high level, and the NMOSFET 10 turns on. Thus, the output current Io starts to flow and the output voltage Vo rises to near the supply voltage VBB.

After that, when, at time point t12, the external control signal S1 falls to low level (that is, the logic level to turn off the NMOSFET 10), the gate driving signal G1 falls to low level, and the NMOSFET 10 turns off. Meanwhile, the inductive load (coil, solenoid, or the like) connected as the load 3 continues to pass the output current Io until the energy stored during the on period of the NMOSFET 10 is discharged. As a result, the output voltage Vo drops to a negative voltage lower than the ground voltage GND.

However, the active clamp circuit 34 operates so as to keep the gate-source voltage Vgs1 of the NMOSFET 10 near the on threshold value voltage Vth of the NMOSFET 10. Thus, the NMOSFET 10 does not fully turn off. Accordingly, the output current Io is discharged via the NMOSFET 10. Meanwhile, the output voltage Vo is limited to equal to or higher than a lower limit voltage VBB-Vclp1 (for example, VBB−50V), which is lower than the supply voltage VBB by an active clamp voltage Vclp1 (=mVz+nVf+Vgs1+Vgs2).

In this way, the active clamp circuit 34, by not letting the NMOSFET 10 fully turn off at its off transition, limits the drain-source voltage Vds (VBB-Vo) of the NMOSFET 10 to equal to or lower than the predetermined active clamp voltage Vclp1.

<Gate Controller (Second Configuration Example)>

Figure 5:
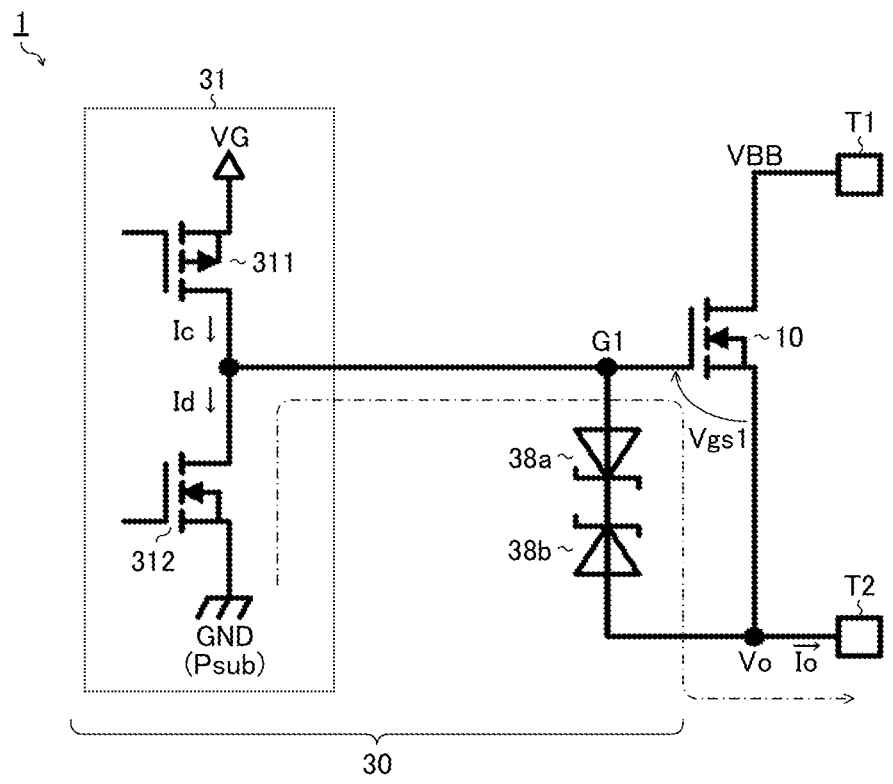
FIG. 5 is a diagram showing a second configuration example of the gate controller (a PSUB process, with no active clamp circuit).

FIG. 5 is a diagram showing a second configuration example of the gate controller 30 (in the case of a PSUB process using a P-type semiconductor substrate Psub). The gate controller 30 of this configuration example includes, as the components of a gate driver 31 that turns on and off the NMOSFET 10, a PMOSFET 311 and an NMOSFET 312. The gate controller 30 of this configuration example does not include an active clamp circuit 34.

The source of the PMOSFET 311 is connected to the output terminal of the charge pump 33 (that is, an application terminal for the boost voltage VG). The drains of the PMOSFET 311 and the NMOSFET 312 are both connected to the gate of the NMOSFET 10. The source of the NMOSFET 312 is connected to an application terminal for the ground voltage GND (that is, the P-type semiconductor substrate Psub).

When the PMOSFET 311 is on and the NMOSFET 312 is off, a charge current Ic flows through the current path from the PMOSFET 311 to the gate of the NMOSFET 10, and thus the gate capacitance of the NMOSFET 10 is charged. As a result, the gate driving signal G1 rises to high level.

By contrast, when the PMOSFET 311 is off and the NMOSFET 312 is on, a discharge current Id flows through the current path from the gate of the NMOSFET 10 to the NMOSFET 312, and thus the gate capacitance of the NMOSFET 10 is discharged. As a result, the gate driving signal G1 falls to low level.

As described above, the gate driver 31 includes a charge path configured to charge the gate of the NMOSFET 10 (that is, a path across which the charge current Ic flows via the PMOSFET 311) and a discharge path configured to discharge the gate of the NMOSFET 10 (that is, a path across which the discharge current Id flows via the NMOSFET 312).

In the gate controller 30 of this configuration example, Zener diodes 38a and 38b are connected instead of the previously described Zener diode 38. The anode of the Zener diode 38a is connected to the gate of the NMOSFET 10. The cathode of the Zener diode 38a is connected to the cathode of the Zener diode 38*b*. The anode of the Zener diode 38*b* is connected to the source of the NMOSFET 10. The Zener diodes 38*a* and 38*b* so connected function as a clamp element that limits the gate-source voltage (=G1-Vo) of the NMOSFET 10 to equal to or lower than a predetermined value.

Incidentally, in the semiconductor integrated circuit device 1 of the PSUB process, when the output voltage Vo falls to equal to or lower than GND-Vf in response to the off transition of the NMOSFET 10, a current flows from the P-type substrate Psub (that is, the application terminal for the ground voltage GND) toward the external terminal T2 (that is, the application terminal for the output voltage Vo). As a result, the clamp voltage for quickly absorbing energy is low.

<Gate Controller (Third Configuration Example)>

Figure 6:
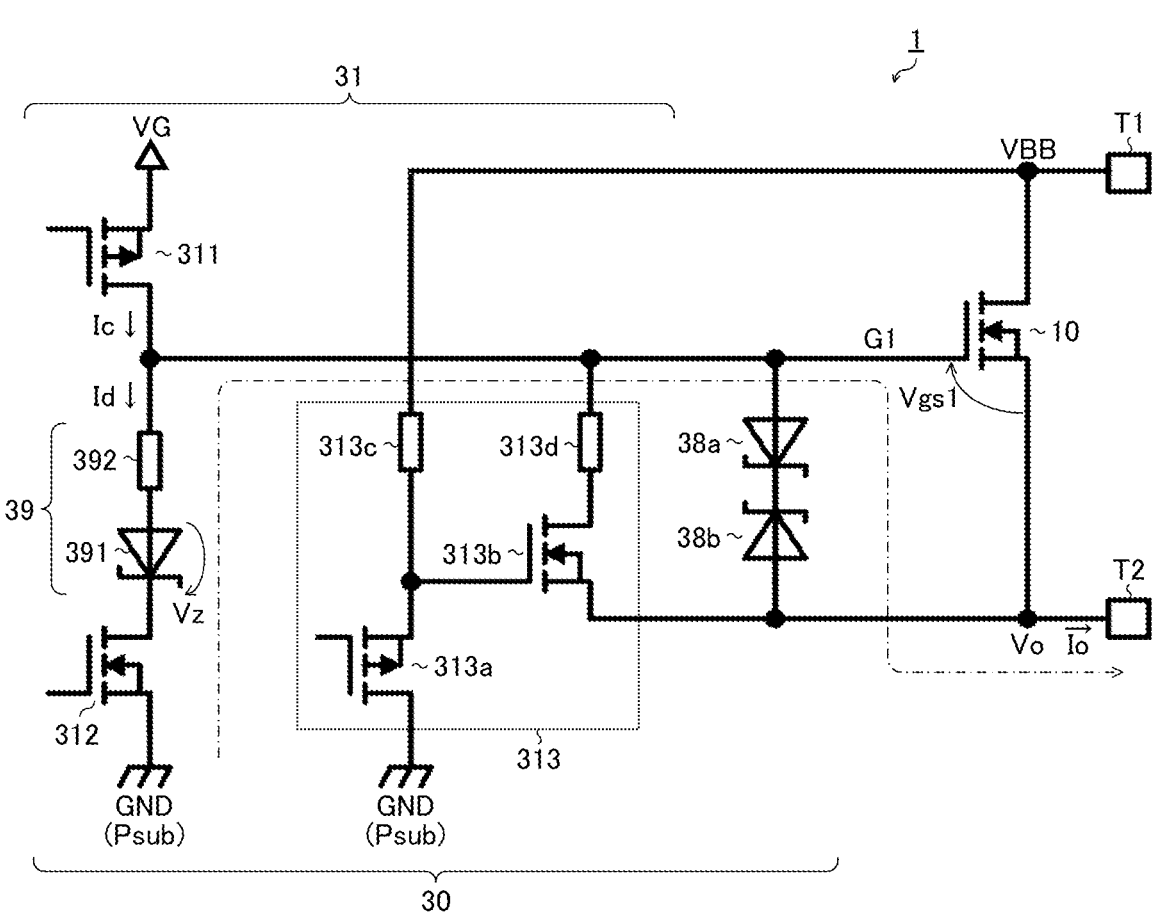
FIG. 6 is a diagram showing a third configuration example of the gate controller (a PSUB process, with an active clamp circuit).

FIG. 6 is a diagram showing a third configuration example of the gate controller 30. The gate controller 30 of this configuration example is based on the second configuration example (see FIG. 5) described above and includes an active clamp circuit 39. The active clamp circuit 39 includes a Zener diode 391 and a resistor 392.

The first end of the resistor 392 is connected to the gate of the NMOSFET 10. The second end of the resistor 392 is connected to the anode of the Zener diode 391. The cathode of the Zener diode 319 is connected to the drain of the NMOSFET 312.

Thus, the Zener diode 391 and the resistor 392 are provided in the discharge path of the gate driver 31 (that is, the path across which the discharge current Id flows).

The active clamp circuit 39 of this configuration example controls the gate driving signal G1 for the NMOSFET 10 so as to keep the output voltage Vo at the off transition of the NMOSFET 10 equal to or higher than a lower limit voltage GND-Vclp2, which is lower than the ground voltage GND by the active clamp voltage Vclp2 (=Vz+Vgs1, where Vz is the breakdown voltage of the Zener diode 391).

That is, the active clamp circuit 39 of this configuration example, as opposed to the active clamp circuit 34 described previously (see FIG. 3), does not set the active clamp voltage Vclp1 with reference to the supply voltage VBB applied to the N-type semiconductor substrate Nsub but sets the active clamp voltage Vclp2 with reference to the ground voltage GND applied to the P-type semiconductor substrate Psub.

In particular, the active clamp circuit 39 of this configuration example has the Zener diode 391 inserted in the discharge path of the gate driver 31. Thus, the active clamp voltage Vclp2 is raised by the breakdown voltage Vz of the Zener diode 391.

However, the insertion of the Zener diode 391 comes with trade-offs. A first trade-off is that in the discharge path via the Zener diode 391, the gate driving signal G1 falls only to the forward drop voltage Vf of the Zener diode 391.

To cope with that, the gate driver 31 of this configuration example additionally includes a short circuit 313 in addition to the discharge path described above. The short circuit 313 short-circuits between the gate and the source of the NMOSFET 10 synchronously as the NMOSFET 10 is turned on and off. In terms of what is shown in FIG. 6, the short circuit 313 has a PMOSFET 313*a*, an NMOSFET 313*b*, and resistors 313*c* and 313*d*.

The first end of the resistor 313*c* is connected to the application terminal for the supply voltage VBB (that is, the external terminal T1). The second end of the resistor 313*c* is connected to the source of the PMOSFET 313*a* and to the gate of the NMOSFET 313*b*. The drain of the PMOSFET 313*a* is connected to the application terminal for the ground voltage GND (that is, the P-type semiconductor substrate Psub). The first end of the resistor 313*d* is connected to the gate of the NMOSFET 10. The second end of the resistor 313*d* is connected to the drain of the NMOSFET 313*b*. The source of the NMOSFET 313*b* is connected to the application terminal for the output voltage Vo (that is, the external terminal T2).

The PMOSFET 313*a* is turned on and off complementarily with the NMOSFET 312. That is, when the NMOSFET 312 is on, the PMOSFET 313*a* is off. When the PMOSFET 313*a* is off, the gate voltage of the NMOSFET 313*b* is pulled up to the supply voltage VBB via the resistor 313*c*. Thus, the NMOSFET 313*b* is on. As a result, the gate and the source of the NMOSFET 10 is short-circuited together via the resistor 313*d* and the NMOSFET 313*b*.

With this short circuit 313 added, the gate driving signal G1 can be dropped down to 0 V. Thus, the NMOSFET 10 can be reliably tuned off.

A second trade-off incurred by the insertion of the Zener diode 391 is the operation of a parasitic element that accompanies the P-type semiconductor substrate Psub. This will now be described with reference to FIG. 7.

Figure 7:
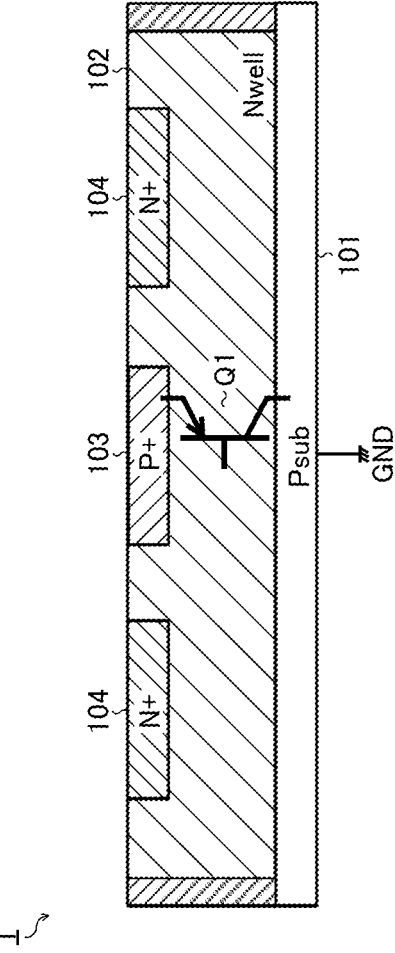
FIG. 7 is a diagram showing one example of a parasitic element that accompanies a P-type semiconductor substrate.

FIG. 7 is a diagram showing one example of a parasitic element that accompanies the P-type semiconductor substrate Psub. The semiconductor integrated circuit device 1 in FIG. 7 includes a P-type semiconductor substrate 101, an N-type semiconductor well 102, a high-concentration P-type semiconductor region 103, and a high-concentration N-type semiconductor region 104.

The P-type semiconductor substrate 101 (corresponding to the P-type semiconductor substrate Psub mentioned above) is fed with the ground voltage GND.

The N-type semiconductor well 102 is formed in the P-type semiconductor substrate 101.

The high-concentration P-type semiconductor region 103 is formed in the N-type semiconductor well 102. The high-concentration P-type semiconductor region 103 corresponds to, for example, the anode of the Zener diode 391.

The high-concentration N-type semiconductor region 104 is formed in the N-type semiconductor well 102 so as to surround the high-concentration P-type semiconductor region 103. The high-concentration N-type semiconductor region 104 corresponds to, for example, the cathode of the Zener diode 391.

The semiconductor integrated circuit device 1 is accompanied by a pnp-type parasitic transistor Q1 having the P-type semiconductor substrate 101 as a collector, the high-concentration P-type semiconductor region 103 as an emitter, and the N-type semiconductor well 102 and the high-concentration N-type semiconductor region 104 as a base.

Thus, if the discharge current Id flows in the forward direction of the Zener diode 391, the parasitic transistor Q1 operates. As a result, a current flows from the high-concentration P-type semiconductor region 103 toward the P-type semiconductor substrate 101.

To cope with that, it is preferable to dispose, on the upstream side of the Zener diode 391 (that is, on its anode side), the resistor 392 to limit the current.

Figure 8:
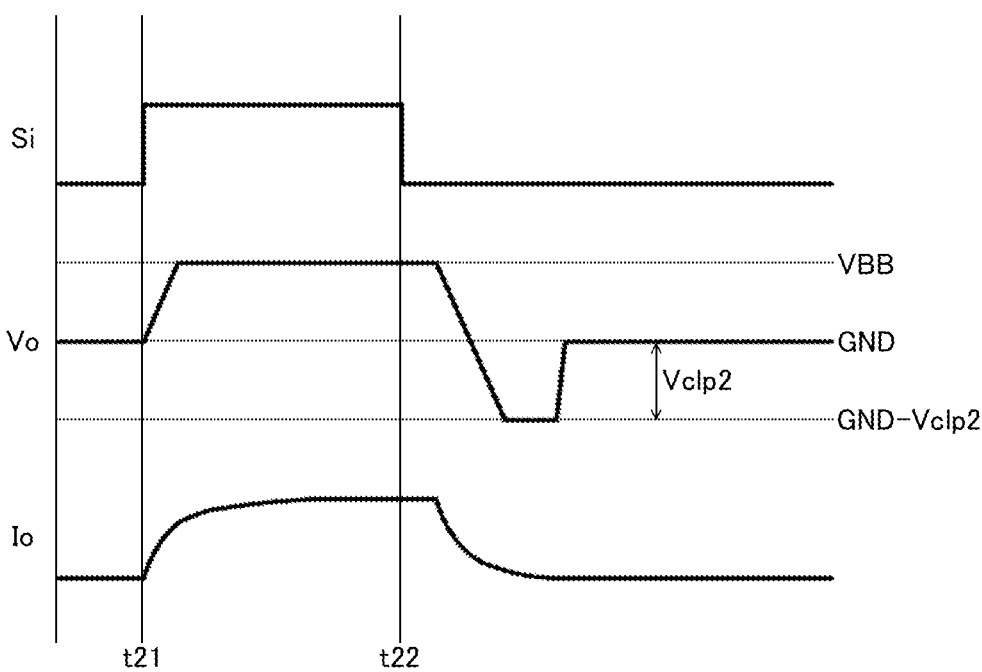
FIG. 8 is a diagram showing active clamp operation in the third configuration example.

FIG. 8 is a diagram showing the active clamp operation by the active clamp circuit 34 of the third configuration example. FIG. 8 depicts, from top down, the external control signal Si, the output voltage Vo, and the output current Io. It is assumed that, as the load 3, an inductive load is connected.

When, at time point t21, the external control signal S1 rises to high level (that is, the logic level to turn on the NMOSFET 10), the gate driving signal G1 rises to high level, and the NMOSFET 10 turns on. Thus, the output current Io starts to flow and the output voltage Vo rises to near the supply voltage VBB.

After that, when, at time point t22, the external control signal S1 falls to low level (that is, the logic level to turn off the NMOSFET 10), the gate driving signal G1 falls to low level, and the NMOSFET 10 turns off. Meanwhile, the inductive load (coil, solenoid, or the like) connected as the load 3 continues to pass the output current Io until the energy stored during the on period of the NMOSFET 10 is discharged. As a result, the output voltage Vo drops to a negative voltage lower than the ground voltage GND.

However, the active clamp circuit 39 operates so as to keep the gate-source voltage Vgs1 of the NMOSFET 10 near the on threshold value voltage Vth of the NMOSFET 10. Thus, the NMOSFET 10 does not fully turn off. Accordingly, the output current Io is discharged via the NMOSFET 10. Meanwhile, the output voltage Vo is limited to equal to or higher than a lower limit voltage GND−Vclp2, which is lower than the ground voltage GND by an active clamp voltage Vclp2 (=Vz+Vgs1).

In this way, the active clamp circuit 39, by not letting the NMOSFET 10 fully turn off at its off transition, limits the drain-source voltage Vds (VBB−Vo) of the NMOSFET 10 to equal to or lower than the predetermined active clamp voltage Vclp2.

<Application to Vehicles>

Figure 9:
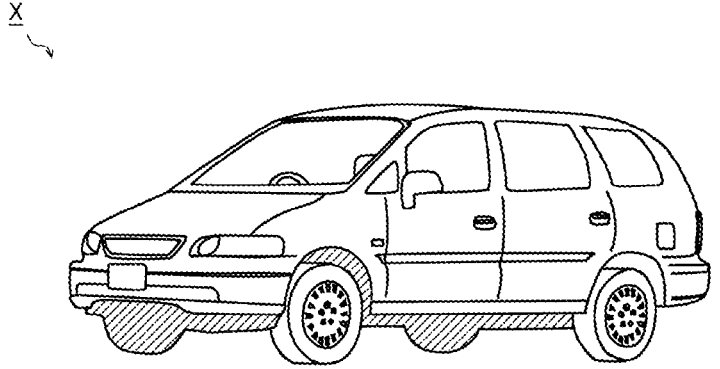
FIG. 9 is a diagram showing an appearance of a vehicle.

FIG. 9 is a diagram showing the exterior appearance of a vehicle. The vehicle X of this configuration example incorporates various electronic devices that operate with electric power supplied from a battery.

The vehicle X can be an engine vehicle, or an electric vehicle (xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

The semiconductor integrated circuit device 1 described previously can be incorporated in any of the electronic devices incorporated in the vehicle X.

Notes

To follow are supplementary notes about the present disclosure.

For example, according to one aspect of what is disclosed herein, a switching device includes: a P-type semiconductor substrate configured to be fed with a ground voltage; a switching element connected between an application terminal for a supply voltage and an application terminal for an output voltage; a driver configured to turn on and off the switching element; and an active clamp circuit configured to control the switching element so as to keep the output voltage at an off transition of the switching element equal to or higher than a lower limit voltage lower than the ground voltage by an active clamp voltage. (A first configuration.)

In the switching device according to the first configuration described above, the active clamp circuit may control the switching element so as not to let the switching element fully turn off at its off transition if the output voltage is lower than the ground voltage. (A second configuration.)

In the switching device according to the first or the second configurations described above, the driver may include: a charge path configured to charge the control terminal of the switching element; and a discharge path configured to discharge the control terminal of the switching element. The active clamp circuit may include a Zener diode provided in the discharge path. (A third configuration.)

In the switching device according to the third configuration described above, the active clamp circuit may further include a resistor connected between the control terminal of the switching element and the Zener diode. (A fourth configuration.)

In any one of the switching devices according to the first to fourth configurations described above, the driver may further include a short circuit configured to short-circuit between the control terminal of the switching element and the application terminal for the output voltage synchronously as the switching element is turned on and off. (A fifth configuration.)

In the switching device according to the fifth configuration described above, the short circuit may include: a first resistor having a first end connected to the application terminal for the supply voltage; a second resistor having a first end connected to the control terminal of the switching element; a first transistor having a first main terminal connected to a second end of the first resistor and a second main terminal connected to the P-type semiconductor substrate; and a second transistor having a first main terminal connected to the application terminal for the output voltage, a second main terminal connected to a second end of the second resistor, and a control terminal connected to the first main terminal of the first transistor. (A sixth configuration.)

In any one of the switching devices according to the first to sixth configurations described above, there may be further provided a clamp element connected between the control terminal of the switching element and the application terminal for the output voltage. (A seventh configuration.)

For example, according to another aspect of what is disclosed herein, an electronic device includes: the switching device according to any one of the first to seventh configurations described above; and a load connected to the switching device. (An eighth configuration.)

In the electronic device according to the eighth configuration described above, the load may be an inductive load. (A ninth configuration.)

For example, according to yet another aspect of what is disclosed herein, a vehicle may include the electronic device according to the eighth or ninth configurations described above. (A tenth configuration.)

According to the present disclosure, it is possible to provide a switching device that can raise the active clamp voltage in a PSUB process, and to provide an electronic device and a vehicle that employ such a switching device.

OTHER MODIFIED EXAMPLES

The various technical features disclosed herein encompasses any modifications made without departure from the spirit of the present disclosure. It should be understood that the above-described embodiments are in every aspect illustrative and not restrictive. The technical scope of the present disclosure is defined not by the description of the embodiments given above but by the appended claims, and encompasses any modifications made without departure from the scope and sense equivalent to those claims.

What is claimed is:

1. A switching device comprising:
   a P-type semiconductor substrate configured to be fed with a ground voltage;
   a switching element connected between an application terminal for a supply voltage and an application terminal for an output voltage;
   a driver configured to turn on and off the switching element; and an active clamp circuit configured to control the switching element so as to keep the output voltage at an off transition of the switching element equal to or higher than a lower limit voltage lower than the ground voltage by an active clamp voltage, wherein the driver includes:

a charge path configured to charge a control terminal of the switching element;

a discharge path configured to discharge the control terminal of the switching element; and a short circuit configured to short-circuit between the control terminal of the switching element and the application terminal for the output voltage synchronously as the switching element is turned on and off, and the active clamp circuit includes an active clamp element provided in the discharge path, and the short circuit includes:

a first resistor having a first end connected to the application terminal for the supply voltage;

a second resistor having a first end connected to the control terminal of the switching element;

a first transistor having a first main terminal connected to a second end of the first resistor and a second main terminal connected to the P-type semiconductor substrate; and a second transistor having a first main terminal connected to the application terminal for the output voltage, a second main terminal connected to a second end of the second resistor, and a control terminal connected to the first main terminal of the first transistor.

2. The switching device according to claim 1, wherein the active clamp circuit controls the switching element so as not to let the switching element fully turn off at its off transition if the output voltage is lower than the ground voltage.

3. The switching device according to claim 1, wherein the active clamp element is a Zener diode.

4. The switching device according to claim 3, wherein the active clamp circuit further includes:

a resistor connected between the control terminal of the switching element and the Zener diode.

5. The switching device according to claim 1, further comprising:

a clamp element connected between the control terminal of the switching element and the application terminal for the output voltage.

6. An electronic device comprising:

the switching device according to claim 1; and a load connected to the switching device.

7. The electronic device according to claim 6, wherein the load is an inductive load.

8. A vehicle comprising:

the electronic device according to claim 6.

* * * * *